(12) United States Patent
Dumoulin

(10) Patent No.: US 6,198,282 B1
(45) Date of Patent: Mar. 6, 2001

(54) OPTIMIZED MRI GRADIENT SYSTEM FOR PROVIDING MINIMUM-DURATION GRADIENT PULSES

(75) Inventor: Charles Lucian Dumoulin, Ballston Lake, NY (US)

(73) Assignee: General Electric Company, Schenectady, NY (US)

( * ) Notice: Subject to any disclaimer, the term of this patent is extended or adjusted under 35 U.S.C. 154(b) by 0 days.

(21) Appl. No.: 09/413,170

(22) Filed: Oct. 7, 1999

(51) Int. Cl.$^7$ ........................................... G01V 3/00

(52) U.S. Cl. ..................... 324/307; 324/318; 324/309

(58) Field of Search ..................... 324/307, 318, 324/309, 322

(56) References Cited

U.S. PATENT DOCUMENTS

| | | | |
|---|---|---|---|
| 5,378,989 | 1/1995 | Barber et al. | 324/318 |
| 5,399,969 | 3/1995 | Bernstein | 324/309 |
| 5,451,878 | 9/1995 | Wirth et al. | 324/322 |
| 5,663,647 | 9/1997 | Wirth et al. | 324/322 |
| 5,680,046 | 10/1997 | Frederick et al. | 324/318 |

*Primary Examiner*—Christine Oda
*Assistant Examiner*—Brij B. Shrivastav
(74) *Attorney, Agent, or Firm*—Jean K. Testa; Donald S. Ingraham

(57) ABSTRACT

An MRI system receives scan parameters from an operator which define the prescribed pulse sequence to be used in acquiring image data. The amplitude and slew rate of gradient pulses in the pulse sequence are calculated based on their prescribed areas to have optimal duration without exceeding physiologic gradient slew rate limits and to produce the pulse area required by the scan parameters.

12 Claims, 4 Drawing Sheets

OPTIMIZED MRI GRADIENT SYSTEM FOR PROVIDING MINIMUM-DURATION GRADIENT PULSES

BACKGROUND OF THE INVENTION

The field of the invention is magnetic resonance imaging (MRI) methods and systems. More particularly, the invention relates to a method and means for producing magnetic field gradients in MRI systems.

When a substance such as human tissue is subjected to a uniform magnetic field (polarizing field $B_0$), the individual magnetic moments of the spins in the tissue attempt to align with this polarizing field along the z-axis. Additionally, there is a wobbling or precession occurring about this magnetic field, the rate of precession being the Larmor frequency. If the substance, or tissue, is subjected to a magnetic field (excitation field $B_1$) which is in the x-y plane and which is near the Larmor frequency, the net aligned moment, $M_z$, may be rotated, or "tipped", into the x-y plane to produce a net transverse magnetic moment $M_t$. A signal is emitted by the excited spins after the excitation signal $B_1$ is terminated, this signal may be received and processed to form an image.

When utilizing these signals to produce images, magnetic field gradients ($G_x$, $G_y$, and $G_z$) are employed. Typically, the region to be imaged is scanned by a sequence of measurement cycles in which these gradients vary according to the particular localization method being used. The resulting set of received MR signals are digitized and processed to reconstruct the image using one of many well known reconstruction techniques.

The magnetic field gradient subsystem of an MRI system is perhaps the most critical subsystem in defining the utility of a scanner. In general, more powerful gradient subsystems give greater applications capability. The power of a gradient subsystem is roughly equivalent to the product of the gradient amplitude and the gradient slew-rate. Gradient amplitude is determined by the current which the gradient amplifiers produce in the gradient coils, and gradient slew rate is the rate at which the gradient amplifiers can change the gradient amplitude.

In many circumstances, the only factor of importance in the generation of a gradient field pulse is the integral of gradient amplitude over the duration of the gradient pulse (i.e. the gradient pulse area). This is true, for example, with slice-select refocusing, phase-encoding, velocity or flow compensation, spoiling, rewinding and readout defocusing gradient pulses. Since the shortest duration gradient pulse of a given area provides the greatest flexibility in selecting pulse sequence echo time (TE) and pulse sequence repetition time (TR), it is highly desirable for the MRI system to produce these gradient pulses with the minimum pulse duration possible given the prescribed pulse area.

There is a need to provide minimum duration gradient pulses that do not operate beyond the physiological limits, for example as established by the Reilly equation.

SUMMARY OF THE INVENTION

The present invention relates to a method and system for production of gradient pulses for use in a MRI pulse sequence, and particularly, optimizing the production of the gradient pulses. Information to indicate the physiological limit on gradient slew rate as a function of gradient amplitude is calculated for the MRI system. An area of a prescribed magnetic field gradient pulse is calculated. The peak gradient amplitude and slew rate are then calculated for a optimal minimum duration pulse having the area of the prescribed magnetic pulse in which the slew rate does not exceed the physiological limit. An optimal magnetic field gradient pulse is produced having the area of the prescribed gradient, and the calculated peak gradient amplitude and gradient slew rate.

DETAILED DESCRIPTION OF THE INVENTION

Figure 2:
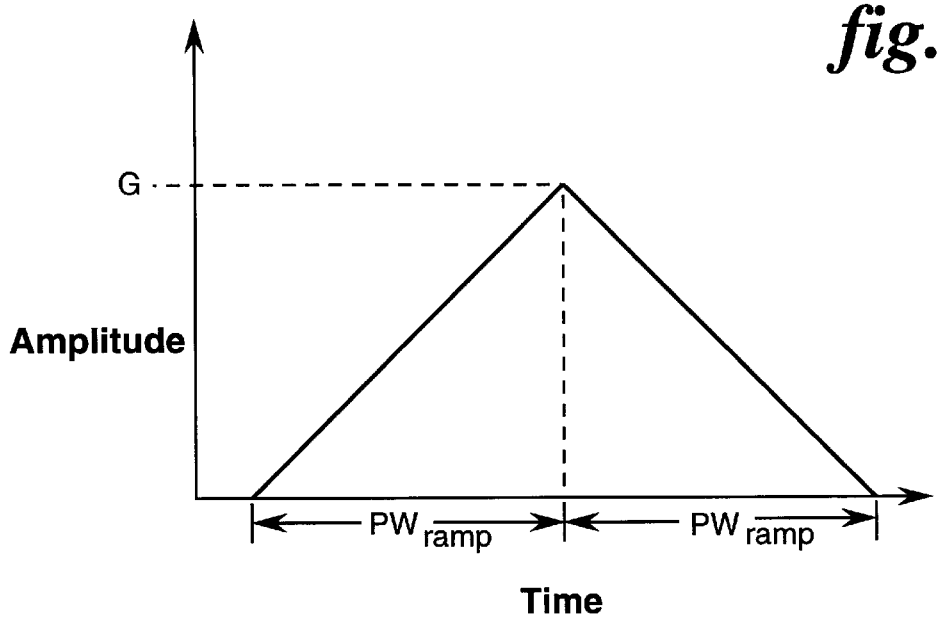
FIG. 2 is a graphic representation of an exemplary triangular gradient pulse.
Figure 3:
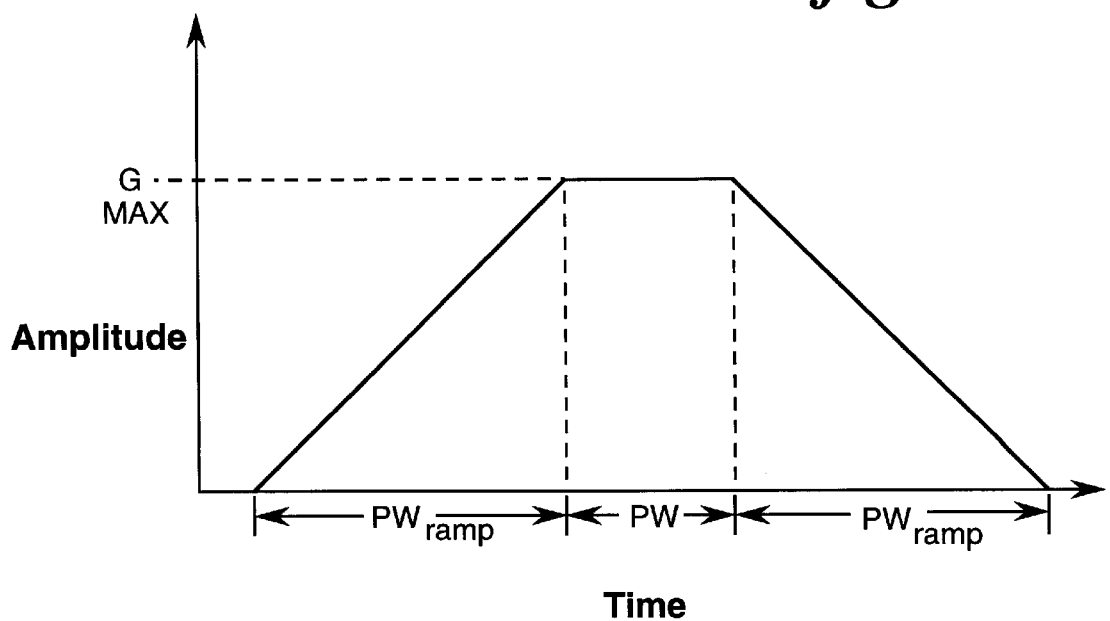
FIG. 3 is a graphic representation of an exemplary trapezoidal gradient pulse.

For a given gradient subsystem, the minimum pulse duration is obtained with a triangular pulse such as that shown in FIG. 2. Here the gradient amplifier is changing the gradient amplitude rapidly until the amplitude reaches a predetermined value. The gradient amplifier then returns the amplitude to zero at a rapid rate. The maximum rate that the driver can change the gradient amplitude is established by the slew rate of the amplifier given in units of G/cm/ms. The triangular pulse is the shortest possible gradient pulse for a given gradient driver since the amplifier is changing the gradient amplitude at the maximum rate, established by amplifier design. A real gradient amplifier, however, has a limit to the amplitude of gradient pulses it can produce. Consequently, when the gradient amplifier must make a gradient pulse having an area greater than that of the largest amplitude triangular pulse, the gradient pulse with optimal duration becomes a trapezoid as shown in FIG. 3. As with the triangular pulse the gradient amplitude rises at a rapid rate until the maximum gradient, $G_{max}$, is reached. The gradient driver then provides a constant gradient amplitude (i.e. current) for a period PW, followed by a rapid return to zero amplitude. For the minimum duration gradient pulse, the constant amplitude is applied at the design current limit of the gradient amplifier.

The area of a gradient pulse is typically determined by scan parameters such as the field-of-view and slice thickness which are input by the operator just prior to a scan. Once the desired area is known, then the system uses the slew rate and maximum amplitude of the MRI system gradient amplifier to determine the timing and amplitude of the gradient pulse. If the slew rate and maximum amplitude of the gradient system are sufficiently high, a triangular gradient waveform, such as that shown in FIG. 2, may be produced. Otherwise, a longer trapezoidal gradient waveform must be produced as shown in FIG. 3, with a consequent lengthening of the minimum possible pulse sequence TE time.

While one could increase the power of the gradient amplifiers such that the maximum prescribed gradient area can be produced with a triangular gradient pulse regardless of its size, this may not solve the problem. The reason for this is the limits placed on maximum gradient switching speed due to physiological effects on the patient. Time-varying magnetic fields induce currents in conductive materials and rapidly changing magnetic field gradients can induce currents in a patient being imaged. Under some circumstances these induced currents can stimulate nerves. As a result, every MRI pulse sequence used on humans must conform to one or more magnetic field rate of change limitations in accordance with FDA regulations. Thus, even though the gradient amplifiers can deliver a desired triangular gradient pulse of prescribed area, physiological limits may preclude its use on humans. Current MRI systems assume the worst possible circumstances and limit the gradient slew rate accordingly.

Most physiological limits placed on the gradient field rate of change are not a single fixed value. Instead, the limit changes as a function of the "transition time" (i.e. the time interval over which the change in gradient field occurs). The reason for allowing higher rates of change (i.e. dB/dt) as the transition time decreases is related to the fact that the electrical sensitivity of neurons decrease with increasing frequency. J. P. Reilly of the Johns Hopkins University Applied Physics Lab has modeled the response of nerve cells and produced an equation predicting the dB/dt threshold for peripheral (PNST) and cardiac nerve stimulation as a function of dB/dt and pulse duration. It should be noted that cardiac stimulation occurs at dB/dt levels about 10 times that of PNST, giving a wide margin of safety. The Reilly PNST equation is the basis for the FDA physiologic limits on dB/dt.

In the triangular gradient pulse of FIG. 2, the integrated area can be easily determined to be:

$$\text{area} = \int G dt = G \times PW_{ramp} \tag{1}$$

This equation by itself, however, is insufficient for the determination of both the pulse timing ($PW_{ramp}$) and amplitude (G). The amplitude and duration are related to each other, however, by the slew rate of the gradient driver:

$$\text{Slew Rate} = G/PW_{ramp} \tag{2}$$

or, $$G = PW_{ramp} \times \text{Slew Rate} \tag{3}$$

Consequently, substituting equation (3), for the amplitude, into equation (1), will calculate the area of the pulse as:

$$\text{area} = \text{Slew Rate} \times (PW_{ramp}); \tag{4}$$

which can be rearranged to give:

$$PW_{ramp} = (\text{area/Slew Rate})^{1/2}. \tag{5}$$

The total time $T_{tri}$, of the triangular pulse is then simply:

$$T_{tri} = 2PW_{ramp} = 2(\text{area/Slew Rate})^{1/2} \tag{6}$$

For a trapezoidal pulse such as the one shown in FIG. 3, the equations are somewhat different. Here the area of the pulse is:

$$\text{area} = G_{max}(PW + PW_{ramp}) \tag{7}$$

Where $G_{max}$ is the maximum gradient amplitude of the gradient amplifier and PW is the duration of the flat-top portion of the pulse. As with the triangular case, the duration of the ramp period is limited by the slew rate and the amplitude of the gradient, but in this case the maximum gradient amplitude of the pulse is determined by the configuration of the scanner, thereby giving:

$$PW_{ramp} = G_{max}/\text{Slew Rate} \tag{8}$$

The area of the trapezoidal pulse is obtained by substituting equation (8) into equation (7) which gives:

$$\text{area} = G_{max}(PW + G_{max}/\text{Slew Rate}) \tag{9}$$

and, solving equation (9) for PW gives:

$$PW = \text{area}/G_{max} - G_{max}/\text{Slew Rate} \tag{10}$$

Since the total time, $T_{trap}$, for the trapezoidal pulse is the sum of the duration of the ramp periods and the flat-top period, the total time can be computed from equations (8) and (10) to be:

$$T_{trap} = PW + 2PW_{ramp} \tag{11}$$

or, $$T_{trap} = \text{area}/G_{max} + G_{max}/\text{Slew Rate} \tag{12}$$

From an applications point-of-view, it is desirable to minimize the duration of the gradient pulses. The use of a triangular gradient pulse which is converted to a trapezoidal pulse only when necessary not only reduces the duration of a pulse, it also by extension, provides a minimal pulse sequence echo time, TE.

Increasing the slew rate will have the effect of reducing pulse duration.

However, important physiological limits must be considered. Slew rates which create dB/dt above threshold levels, established for example by the Reilly equation, induce nerve stimulation in patients. For any gradient coil, dB/dt is directly proportional to the slew rate, and varies as a function of position in and around the gradient coil. The geometry of the coil will also have a substantial effect. For example, the maximum dB/dt in a shorter cylindrical coil will be lower than the maximum dB/dt in a longer coil.

There is an upper limit to the amount of usable electrical current (and by extension power) for all gradient subsystems, and this upper limit is defined solely by the threshold of physiological stimulation and the maximum gradient pulse area for all applications.

Starting with equation (9) for calculating the area of the gradient pulse, and assuming that PW=0 (i.e. a triangular gradient pulse at the transition point), then the area of the gradient pulse is defined as:

$$\text{area} = (G_{max})2/\text{Slew Rate}. \tag{13}$$

The maximum useable gradient strength, $G_{max}$, can then be defined in terms of the maximum area pulse for all applications, $\text{area}_{max}$:

$$G_{max} = (\text{area}_{max} \times \text{Slew Rate})^{1/2} \tag{14}$$

The maximum area pulse is defined as the largest gradient pulse area that will ever be needed for all applications.

Figure 4:
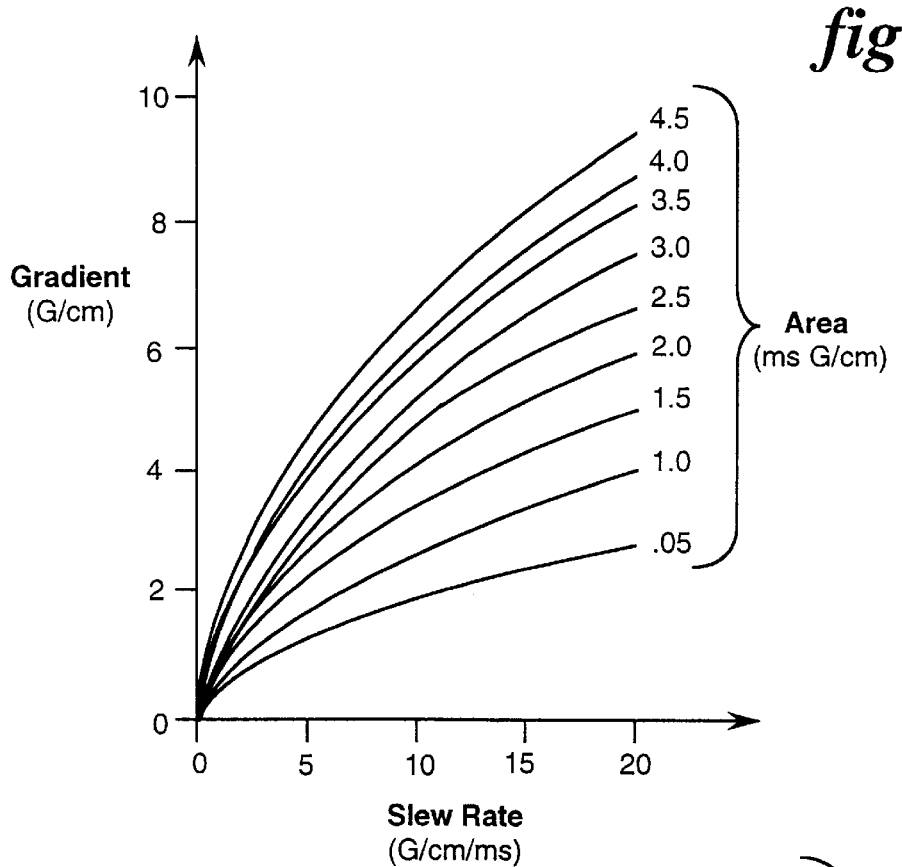
FIG. 4 is a graphic representation of equations which relate gradient pulse amplitude to gradient pulse slew rate for a set of different gradient pulse areas.

FIG. 4 is a graphical representation of equation (14) and is used for determining the optimal gradient subsystem design. Starting with a gradient coil design having a given length and efficiency, one first selects a slew rate. Then, one chooses the area of the largest gradient pulse which encompasses all pulse sequences to be performed by the MRI system. Equation (14) or FIG. 4 is then used to calculate the maximum gradient current that needs to be supplied by the gradient subsystem. In this calculation it is assumed that the limitation on slew rate is a constant value. Slew rate limits based upon physiological stimulation limits, however, are not constant, but instead depend on the slew rate and on the duration of the gradient pulse. Consequently, if the simplistic assumption is made, one must fix the limitation on slew rate at a single, worst case value.

As described above, J. P. Reilly from Johns Hopkins University has modeled the response of nerve cells and has developed a theory of peripheral nerve stimulation in which the physiologic limit is dependent upon the duration of the gradient ramp time. His work has resulted in an equation which has become known as the "Reilly Curve". The Reilly equation describes the limit of peripheral nerve stimulation as:

$$dB/dt_{(Limit)} = dB/dt_{(infinity)}(1+t_{factor}/PW_{ramp}) \quad (15)$$

where $dB/dt_{(infinity)}$ is the physiologic limit for Peripheral Nerve Stimulation (PNST) for infinitely long ramp times (given in Tesla/s), $t_{factor}$ is a time scaling factor determined by Reilly (given in $\mu$sec) and $PW_{ramp}$ is the duration of the ramp of a gradient pulse.

All gradient coil designs intended for human use will have a physiologic limit given by the Reilly equation (15). The slew rate which gives the limit, however, will depend on the effective length of the coil. The physiologic slew rate limit is determined by dividing the Reilly limit by the effective length of the gradient coil, L:

$$Slew(Limit) = dB/dt_{(Limit)}/L. \quad (16)$$

Note that in this equation, the effective length L is not necessarily the true length of the coil. Rather, it is the distance between the iso-center of the gradient coil and the point within the coil that has the maximum dB/dt exposure for the patient (or operator). This distance should be corrected for deviations from non-linearity. For a cylindrical gradient coil, this distance is roughly equal to the distance from the iso-center of the gradient coil to the location of maximum field variation caused by the coil in the Z direction. In the radial dimensions, however, this distance is equal to the patient-bore radius because the location of maximum field variation is within the walls of the MR system.

The physiologic slew rate limit for a triangular pulse can be determined by substituting the calculation for pulse timing $PW_{ramp}$ from Eq. 5 into Eqs. (15) and (16) to give:

$$Slew_{(Limit)} = dB/dt_{(infinity)}(1+t_{factor}/(area/Slew\ Rate)^{1/2})/L \quad (17)$$

Figure 5:
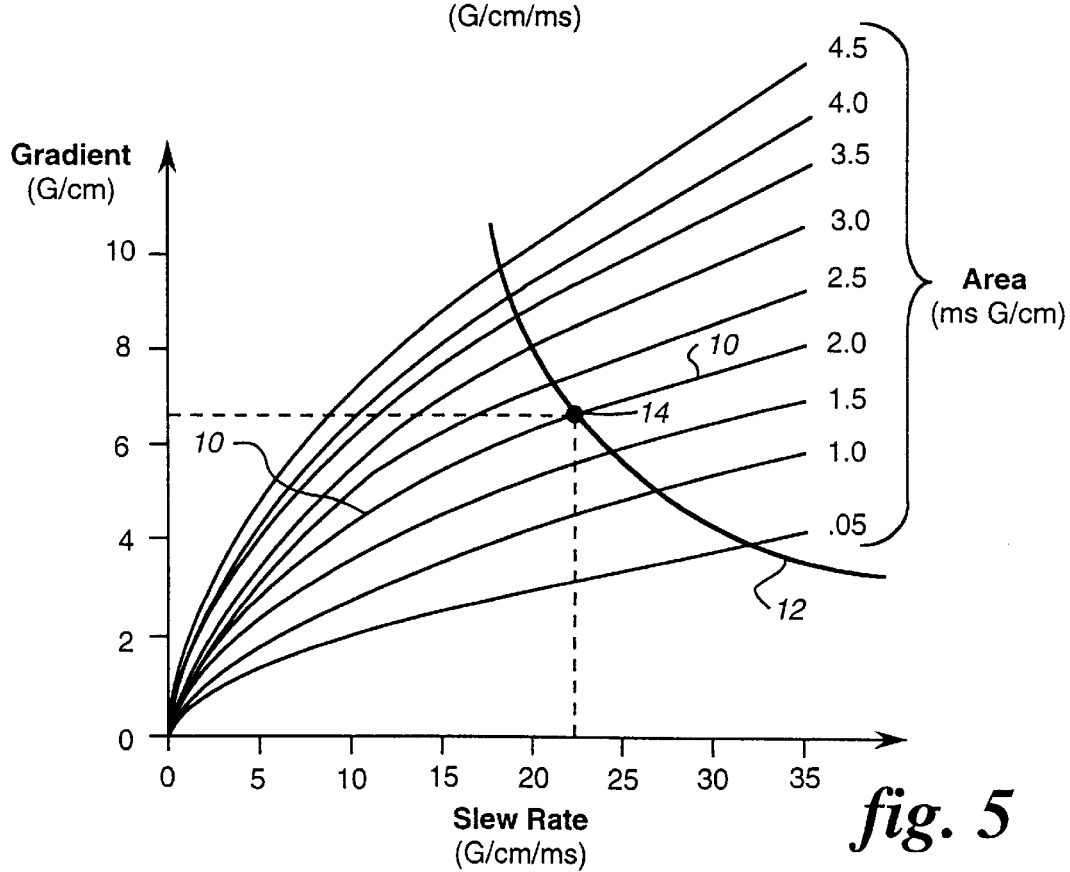
FIG. 5 is a graphic representation of equations of FIG. 4 illustrating how the optimal gradient pulse is determined using an equation which relates the physiological slew rate limit as a function of gradient amplitude.

Using Eq. (17) and the machine specific parameter value for gradient coil length L, and the physiologic limit parameters $dB/dt_{(infinity)}$ and time scaling factor $t_{factor}$, the physiologic slew rate limit can be calculated for use with Eq. (14). This is illustrated graphically in FIG. 5. For any prescribed gradient pulse its area is calculated. Then, the curve for that area (e.g. curve 10 for an area of 2.0 msG/cm) is followed up from the origin until this physiologic limit curve 12 is reached at the intersection 14. This intersection 14 indicates the gradient slew rate and the gradient amplitude which will provide the shortest possible gradient pulse for the prescribed area without exceeding the physiologic limit.

In the present invention, this method for calculating the shortest possible gradient pulse for a prescribed gradient pulse is employed in an MRI system to produce the optimal pulse sequence. After the operator enters the prescribed scan parameter, the MRI system calculates the gradient pulses necessary to perform the pulse sequence. Generally, the shape of slice select and frequency encoding gradient pulses in conventional imaging are critical. These gradients should remain constant during the application of the RF excitation pulse and during the detection of the MR signal. However, there are also applications for which the shape of the gradient pulse is not critical, for example refocusing lobes, defocusing lobes, crushers, spoilers, flow-compensation, flow-encoding and phase-encoding. The present invention is employed to calculate the slew rate and amplitude of each gradient pulse whose shape is not critical, and to minimize the gradient pulse duration. This, in turn, optimizes the TE and TR to be specified for the pulse sequence.

A number of scan parameters entered by the operator are used to produce gradient pulses. For example, the specified field of view in the phase encoding direction determines the area required by the phase encoding gradient pulses. Parameters related to the velocity of the subject (e.g. flowing blood) are input and employed to produce velocity encoding gradient pulses or flow compensation gradient pulses. For velocity encoding, for example, the operator chooses a VENC (velocity encoding value in units of cm/s). That VENC then determines the area of each lobe in a bipolar gradient pulse. The determination follows the equation:

velocity induced phase shift=$\gamma \times VENC \times T \times$Gradient Area where T is the time separation of the bipolar gradient lobes. Gamma ($\gamma$) is the gyromagnetic ratio (4257 Hz/Gauss). Solving this equation for Area and assuming a $\pi/2$ phase shift for VENC gives:

Gradient Area=$(\pi/2)/(\gamma \times VENC \times T)$.

Flow compensation uses the same equations, but the flow-encoding gradient is applied differently. With flow compensation, the velocity-induced phase shifts arising from the slice selection and frequency encoding gradient waveforms are determined and then the area of the necessary flow compensation pulses are then computed. The flow-compensation gradient pulses are then applied so that their effect cancels that arising from the slice selection and frequency encoding.

Figure 1:
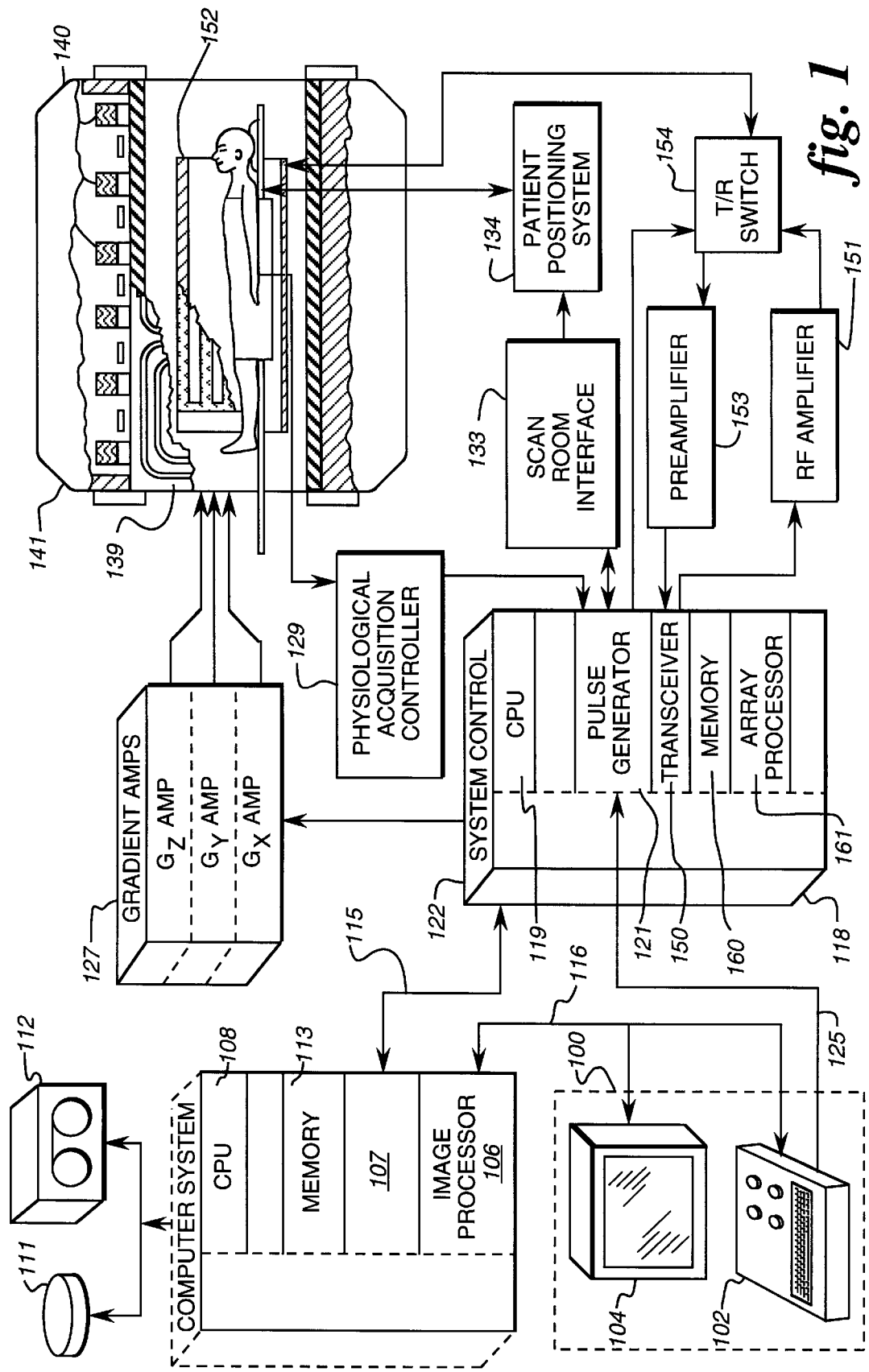
FIG. 1 is a block diagram of a MRI system that employs the present invention.

Referring first to FIG. 1, there is shown the major components of a preferred MRI system which incorporates the present invention. The operation of the system is controlled from an operator console 100 which includes a keyboard and control panel 102 and a display 104. The console 100 communicates through a link 116 with a separate computer system 107 that enables an operator to control the production and display of images on the screen 104. The computer system 107 includes a number of modules which communicate with each other through a backplane. These include an image processor module 106, a CPU module 108 and a memory module 113, known in the art as a frame buffer for storing image data arrays. The computer system 107 is linked to a disk storage 111 and a tape drive 112 for storage of image data and programs, and it communicates with a separate system control 122 through a high speed serial link 115.

The system control 122 includes a set of modules connected together by a backplane 118. These include a CPU module 119 and a pulse generator module 121 which connects to the operator console 100 through a serial link 125. It is through this link 125 that the system control 122 receives commands from the operator which indicate the scan sequence that is to be performed. As will be described in more detail below, the operator enters parameters which indicate the prescribed scan. From these parameters a pulse sequence is calculated and downloaded to the pulse generator module 121.

The pulse generator module 121 operates the system components to carry out the desired scan sequence. It produces data which indicates the timing, strength and shape of the RF pulses which are to be produced, and the timing of and length of the data acquisition window. The pulse generator module 121 connects to a set of gradient amplifiers 127, to indicate the timing and shape of the gradient pulses to be produced during the scan. The pulse generator module 121 also receives patient data from a physiological acquisition controller 129 that receives signals from a number of different sensors connected to the patient, such as ECG signals from electrodes or respiratory signals from a bellows. And finally, the pulse generator module 121 connects to a scan room interface circuit 133 which receives signals from various sensors associated with the condition of the patient and the magnet system. It is also through the scan room interface circuit 133 that a patient positioning system 134 receives commands to move the patient to the desired position for the scan.

The gradient waveforms produced by the pulse generator module 121 are applied to a gradient amplifier system 127 comprised of $G_x$, $G_y$ and $G_z$ amplifiers. Each gradient amplifier excites a corresponding gradient coil in an assembly generally designated 139 to produce the magnetic field gradients used for position encoding acquired signals. The gradient coil assembly 139 forms part of a magnet assembly 141 which includes a polarizing magnet 140 and a whole-body RF coil 152. A transceiver module 150 in the system control 122 produces pulses which are amplified by an RF amplifier 151 and coupled to the RF coil 152 by a transmit/receive switch 154. The resulting signals radiated by the excited nuclei in the patient may be sensed by the same RF coil 152 and coupled through the transmit/receive switch 154 to a preamplifier 153. The amplified MR signals are demodulated, filtered, and digitized in the receiver section of the transceiver 150. The transmit/receive switch 154 is controlled by a signal from the pulse generator module 121 to electrically connect the RF amplifier 151 to the coil 152 during the transmit mode and to connect the preamplifier 153 during the receive mode. The transmit/receive switch 154 also enables a separate RF coil (for example, a head coil or surface coil) to be used in either the transmit or receive mode.

The MR signals picked up by the RF coil 152 are digitized by the transceiver module 150 and transferred to a memory module 160 in the system control 122. When the scan is completed and an entire array of data has been acquired in the memory module 160, an array processor 161 operates to Fourier transform the data into an array of image data. This image data is conveyed through the serial link 115 to the computer system 107 where it is stored in the disk memory 111. In response to commands received from the operator console 100, this image data may be archived on the tape drive 112, or it may be further processed by the image processor 106 and conveyed to the operator console 100 and presented on the display 104.

The power capability ($P_{max}$) of the gradient amplifiers 127 is determined by the maximum area gradient pulse expected to be produced ($area_{max}$) and the maximum slew rate to be produced. Since the slew rate of a scanner is proportional to the voltage of the gradient amplifier and the maximum gradient is proportional to drive current, the gradient power, P, applied to the spins can be described as:

$$P = \text{Slew Rate} \times G_{max} \qquad (18)$$

Gradient coils are optimally designed such that the resistive losses in the coil are relatively small and the gradient power applied to the spins is approximately proportional to the power delivered by the gradient amplifiers 127 (typically within 10%). Consequently, Eq. (14) can be substituted into Eq. (18) to give the maximum useable power, $P_{max}$, for the gradient amplifiers designed for a given optimal applications performance:

$$P_{max} = \text{Slew Rate} \times (area_{max} \times \text{Slew Rate})^{1/2} \qquad (19)$$

Equation (19) defines a boundary between two types of behavior. If the power of the gradient amplifiers 127 is larger than $P_{max}$ at a given slew rate then gradient pulse duration is independent of system power. In other words, adding more power will not shorten the gradient pulse.

Figure 6:
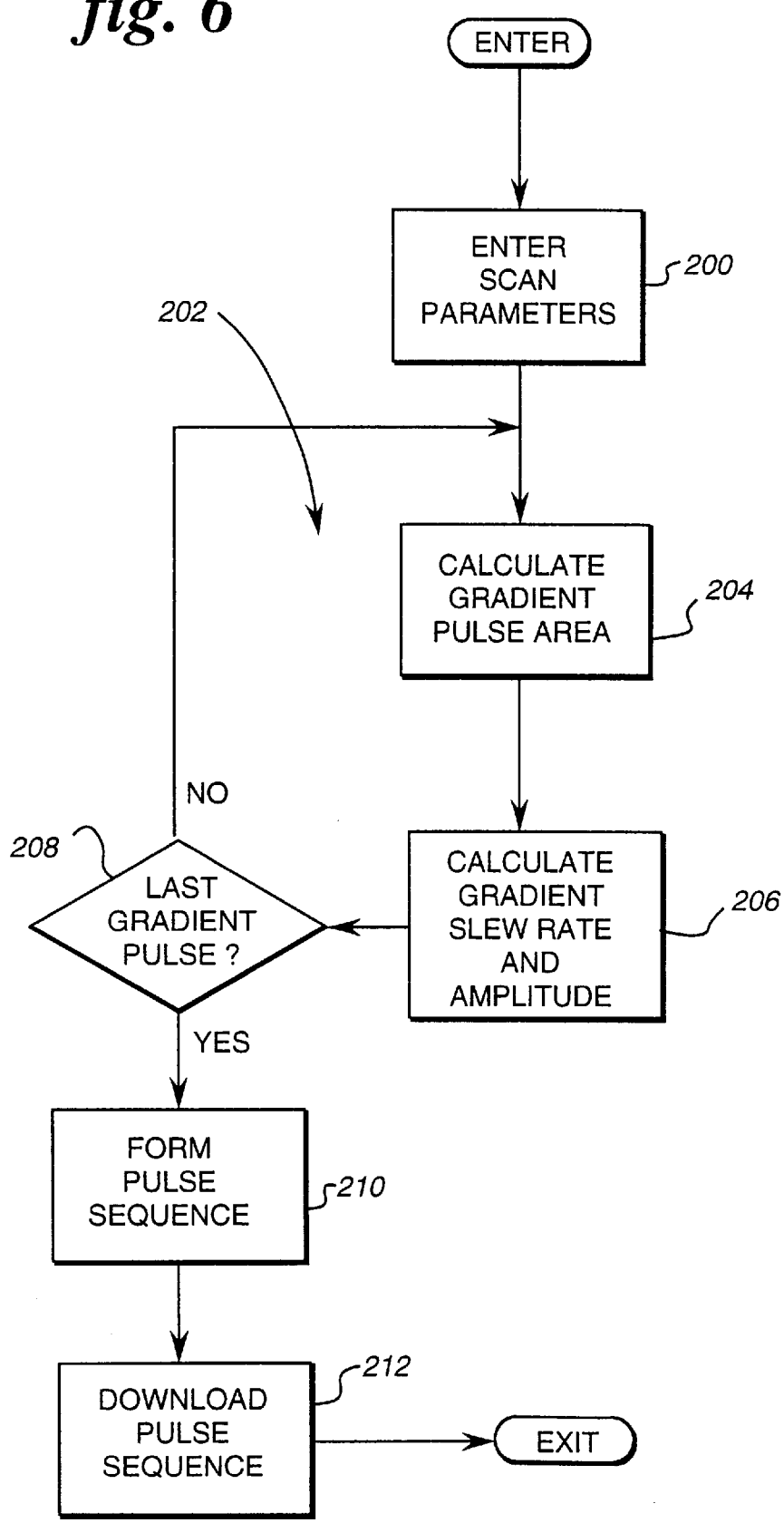
FIG. 6 is a flow chart illustrating the operation of the MRI system of FIG. 1 to practice the preferred embodiment of the invention.

Referring particularly to FIG. 6, prior to performing a patient scan the operator enters a set of scan parameters as indicated at process block 200. These scan parameters include such things as field of view, slice thickness, spin velocity and image resolution. These parameters determine the area of certain gradient pulses in the prescribed pulse sequence, and the system enters a loop indicated at 202 in which the area of each such gradient pulse is calculated as indicated at process block 204.

The MRI system stores an equation which indicates the slew rate limit as a function of gradient pulse area according to Eq. (17) above. This equation meets the applicable physiologic limitations on dB/dt and is approved in accordance with regulatory standards. This physiological equation along with another stored equation corresponding to Eq. (14) described above, is then used to calculate the slew rate and the gradient pulse amplitude as indicated at process block 206.

Each gradient pulse in the pulse sequence which does not require a particular shape is defined in this manner to produce the shortest possible gradient pulse. When the last such gradient pulse has been defined as determined at decision block 208, the pulse sequence is formed as indicated at process block 210. This step may include prompting the operator with a message indicating the shortest TE and TR times possible with the prescribed sequence. The final pulse sequence is then downloaded to the pulse generator 121 as indicated at process block 212.

Some of the gradient pulses remain the same throughout the scan, whereas others, such as the phase encoding gradient pulse are stepped through a set of values (i.e. gradient areas) as the scan is performed. The largest phase encoding gradient pulse is calculated as described above, since it determines the minimum TE and TR periods possible. The remaining smaller phase encoding gradient pulses may be precalculated, or they may be calculated in real time as the scan is performed by simply reducing the gradient amplitude an appropriate amount.

The present invention enables a gradient subsystem to be used which has a power and slew rate capability that exceeds that required by most applications.

By using the above described method, the gradients produced by the gradient subsystem will be suitably de-rated and will not operate beyond the Reilly curve, but will provide minimum duration gradient pulses. In addition, there are situations in which a fixed slew rate limit is not to be exceeded. For example, if the gradient subsystem is limited to a specific voltage by design constraints, the slew rate is limited because it is proportional to the voltage applied to the gradient coils. The present invention enables the optimal gradient amplitude (i.e. current) to be determined to achieve the minimum duration gradient pulse with the given slew-rate limitation.

From the preceding description of various embodiments of the present invention, it is evident that the objects of the invention are attained. Although the invention has been described and illustrated in detail, it is to be clearly understood that the same is intended by way of illustration and example only and is not to be taken by way of limitation. Accordingly, the spirit and scope of the invention are to be limited only by the terms of the appended claims.

What is claimed is:

1. A method for producing a magnetic field gradient pulse with an Magnetic Resonance Imaging (MRI) system, the steps comprising:
   a) inputting a set of scan parameters which define a prescribed pulse sequence for acquiring image data with the MRI system;
   b) calculating the area of a magnetic field gradient pulse using at least one of said scan parameters;
   c) calculating the peak gradient amplitude and slew rate of a triangular gradient pulse having the calculated area of the magnetic field gradient pulse, and in which the slew rate does not exceed a physiologic slew rate limit calculated relative to the gradient amplitude of the triangular pulse; and,
   d) producing a magnetic field gradient pulse during the performance of said prescribed pulse sequence by the MRI system, the gradient pulse having a minimum duration based on the calculated peak gradient amplitude and the slew rate.

2. The method as recited in claim 1 in which step of calculating the peak gradient amplitude and slew rate of a triangular pulse is performed by using an equation which relates peak gradient amplitude to slew rate for the calculated area.

3. The method as recited in claim 2 in which the equation is $$G = (\text{area} \times \text{slew rate})^{1/2},$$

where: G=peak gradient amplitude,
area=calculated area of gradient pulse, and
slew rate=slew rate.

4. A method for producing a minimum duration magnetic field gradient pulse with an Magnetic Resonance Imaging (MRI) system, the steps comprising:
   a) inputting scan parameters;
   b) calculating a desired area of the magnetic field gradient pulse from at least one of the inputted scan parameters;
   c) calculating a relationship between gradient amplitude and gradient slew rate for a triangular gradient pulse waveform having the desired magnetic field gradient pulse area;
   c) defining limits for gradient pulse slew rate and gradient pulse amplitude based upon a selected physiological model; and,
   d) calculating the gradient pulse amplitude and gradient pulse slew rate for the minimum duration gradient pulse that yields the calculated desired area of the magnetic field gradient pulse without exceeding the defined limits for gradient pulse amplitude and gradient pulse slew rate.

5. The method as recited in claim 4 in which one of the input scan parameters is image field of view, and this scan parameter is employed in step b).

6. The method as recited in claim 4 in which one of the input scan parameters is slice thickness of an image to be acquired by the MRI system.

7. The method as recited in claim 4 in which one of the input scan parameters relates to velocity of a subject to be imaged by the MRI system.

8. The method as recited in claim 4 in which the relationship calculated in step c) has the form:

$$\text{Area} = (\text{gradient amplitude})^2 / \text{slew rate}.$$

9. The method as recited in claim 4 in which the selected physiological model for the limit of gradient pulse slew rate ($dB/dt_{(limit)}$) is based upon the equation:

$$dB/dt_{(limit)} = dB/dt_{(infinity)}(1 + t_{factor}/PW_{ramp})$$

where $dB/dt_{(infinity)}$ is the physiologic limit for peripheral nerve stimulation, $t_{factor}$ is a time scaling factor and $PW_{ramp}$ is the duration of a gradient pulse ramp.

10. The method as recited in claim 4 in which the selected physiological model for the limit of gradient pulse slew rate and the limit of gradient pulse amplitude is independent of gradient pulse amplitude and is a selected gradient slew rate.

11. A magnetic field gradient system for an Magnetic Resonance Imaging (MRI) system, the combination comprising:
   a gradient coil;
   a gradient amplifier connected to the gradient coil and being operable in response to a gradient waveform for producing current in the gradient coil for generating a magnetic field gradient, the gradient amplifier having a power sufficient to exceed a physiological safety limit;
   an operator console for receiving scan parameters from an operator;
   a pulse generator coupled to the operator console for producing the gradient waveform during the acquisition of image data by the MRI system;
   controller connected to the pulse generator for calculating the gradient waveform based on the value of an input scan parameter, the calculated gradient waveform being configured to have a minimum duration without causing the gradient amplifier to exceed the physiological safety limit.

12. The system as recited in claim 11 in which the controller calculates the gradient waveform by calculating a relationship between the gradient amplifier amplitude and slew rate.

* * * * *